United States Patent
Goodson

(10) Patent No.: US 7,590,921 B1
(45) Date of Patent: Sep. 15, 2009

(54) DATA COMMUNICATION SYSTEM AND METHOD

(75) Inventor: Richard Goodson, Huntsville, AL (US)

(73) Assignee: ADTRAN, Inc., Huntsville, AL (US)

( * ) Notice: Subject to any disclaimer, the term of this patent is extended or adjusted under 35 U.S.C. 154(b) by 521 days.

(21) Appl. No.: 11/295,357

(22) Filed: Dec. 6, 2005

(51) Int. Cl.
*H03M 13/00* (2006.01)

(52) U.S. Cl. .................. 714/774; 714/746; 714/784; 714/795; 714/796

(58) Field of Classification Search ................. 714/774
See application file for complete search history.

(56) References Cited

U.S. PATENT DOCUMENTS

| | | | |
|---|---|---|---|
| 4,389,636 A | 6/1983 | Riddle, Jr. | |
| 4,998,252 A | 3/1991 | Suzuki et al. | |
| 5,737,337 A | 4/1998 | Voith et al. | |
| 5,923,642 A | 7/1999 | Young | |
| 6,081,919 A | 6/2000 | Fujiwara et al. | |
| 6,118,825 A | 9/2000 | Ikeda et al. | |
| 6,278,716 B1 | 8/2001 | Rubenstein et al. | |
| 6,347,075 B1 | 2/2002 | Barzegar et al. | |
| 6,480,976 B1 | 11/2002 | Pan et al. | |
| 6,683,855 B1 | 1/2004 | Bordogna et al. | |
| 6,721,373 B1* | 4/2004 | Frenkel et al. | 375/346 |
| 6,895,546 B2 | 5/2005 | Ivry | |
| 7,170,876 B2* | 1/2007 | Wei et al. | 370/335 |
| 7,224,994 B2* | 5/2007 | Tayloe et al. | 455/522 |
| 2005/0066250 A1 | 3/2005 | Coleman et al. | |
| 2005/0220180 A1* | 10/2005 | Barlev et al. | 375/222 |
| 2007/0218936 A1* | 9/2007 | Waxman et al. | 455/522 |
| 2008/0098287 A1* | 4/2008 | Kolze et al. | 714/795 |

OTHER PUBLICATIONS

"Proposed TDIM Bonding Protocol, T1E1.4/2003-271R2," American National Standard for Telecommunications, Committee T1 Telecommunications, Working Group T1E1.4 (DSL Access), San Diego, Dec. 8-11, 2003.

* cited by examiner

*Primary Examiner*—Guy J Lamarre
*Assistant Examiner*—Sam Rizk
(74) *Attorney, Agent, or Firm*—Lanier Ford Shaver & Payne, P.C.

(57) ABSTRACT

A data communication system has a plurality of communication transceivers respectively coupled to a plurality of communication lines and is configured to receive payload symbols and parity symbols. The system further has logic configured to transition from non-erasure decoding to erasure decoding based on a measured communication performance of one of the communication lines coupled to one of the plurality of transceivers.

12 Claims, 5 Drawing Sheets

DATA COMMUNICATION SYSTEM AND METHOD

RELATED ART

In conventional forward error correction (FEC) communication systems, data is often encoded into code words before being transmitted to a receiver at a remote premise. Each code word typically comprises at least one symbol indicative of data, hereinafter referred to as a "payload symbol," and each symbol in the codeword usually has the same bit length.

In encoding data into a code word, an encoder typically appends, to the payload symbols, additional data, sometimes collectively referred to as "parity symbols." The parity symbols within a the particular code word comprise redundant information about the payload symbols, and this redundant information may be used to recover one or more payload symbols of the code word if part of the code word is corrupted during transmission.

A particular type of FEC scheme, referred to as "erasure decoding," can be employed when the location of an error is known. In erasure decoding, an erasure decoder is normally provided with an input signal that is used to flag erasures. An erasure generally refers to a symbol that has been marked (e.g., flagged) as being in error, and an erasure decoder is normally configured to use the transmitted parity symbols to recover the flagged erasures. Since an erasure decoder does not need to use parity symbols to determine error locations, the erasure decoder is usually able to correct for more errors as compared to other decoders. Indeed, erasure decoding normally allows for up to twice the error correction capacity as FEC schemes that use the parity symbols to identify error locations as well as determine the magnitude of the errors. Moreover, if there are fewer erasures than the error correction capacity, the erasure decoder will use the remaining capacity to correct errors that are not marked as erasures. Note that decoding other than erasure decoding, as described hereinabove, is hereinafter referred to as "non-erasure decoding."

In some communication systems, a backup line is used to protect communication occurring across at least one primary line. Normally, data is communicated over the primary line while the backup line remains idle (i.e., does not communicate data). If communication over the primary line is interrupted or if the error rate of the primary line becomes significantly degraded, then communication may be switched from the primary line to the backup line.

Unfortunately, inefficiencies occur as communication over the primary line is switched from the primary line to the backup line. For example, additional signaling between the communicating transceivers is usually necessary to effectuate such a line switch. In addition, reconfiguring the transceivers for transmission over the backup line in lieu of the primary line can introduce delays and disrupt data flows at the transceivers. Furthermore, when communication over the primary line is not interrupted or the error rate of the primary line is not significantly degraded, no benefit is being derived from the backup line. In this regard, when the primary line is operating properly, the backup line is idle.

Thus, the present disclosure provides systems and methods that use an additional line to increase the information capacity of the system having a plurality of lines, and this added system capacity is used to carry additional parity symbols. In so providing, the system exhibits increased robustness to random error events by using non-erasure decoding. Further, if one line suffers from substantial performance degradation, as described herein, then data from that line is marked as an erasure and erasure decoding can be used to recover all of the payload data from that line. Additionally, no communication line is required between a transmission system and a receiving system to indicate a switch between non-erasure decoding and erasure decoding.

Moreover, better techniques for handling communication problems between two transceivers communicating over a telecommunication line are generally desired.

SUMMARY OF THE DISCLOSURE

Generally, embodiments of the present disclosure provide data communication systems and methods for selectively implementing erasure decoding based upon system performance.

A communication system in accordance with one embodiment of the present disclosure comprises a plurality of communication lines and is configured to receive payload symbols and parity symbols. The system further has logic configured to transition from non-erasure decoding to erasure decoding based on a measured communication performance of one of the communication lines coupled to one of the plurality of transceivers.

A communication method in accordance with another embodiment of the present disclosure comprises receiving payload symbols and parity symbols via a plurality of transceivers and transitioning from non-erasure decoding to erasure decoding based on a measured communication performance of one of the communication lines coupled to one of the plurality of transceivers.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Figure 1:
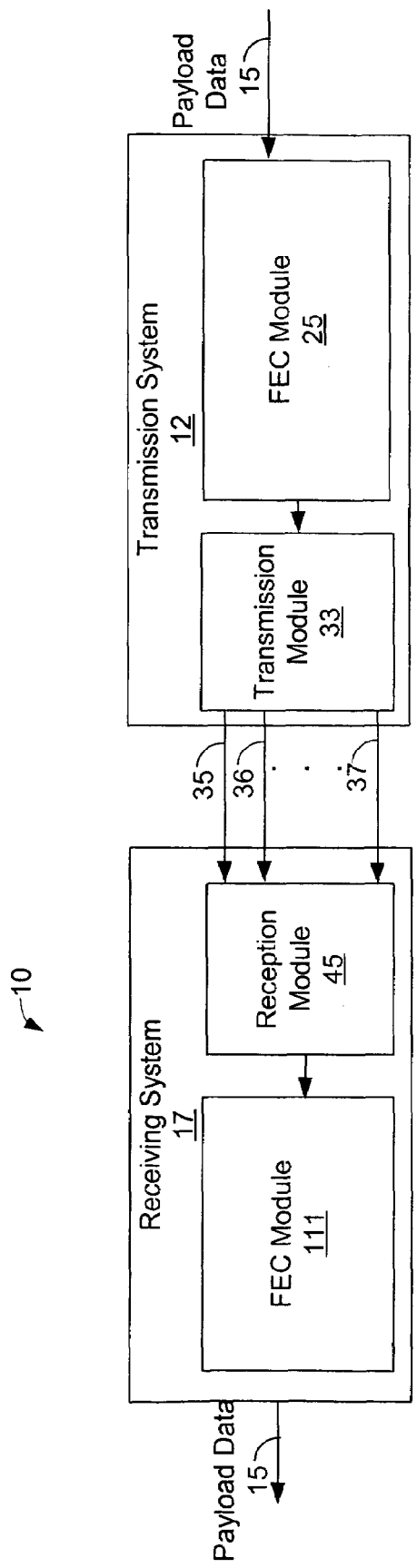
FIG. 1 is a block diagram illustrating an exemplary communication system of the present disclosure.

The present disclosure generally relates to forward error correction (FEC) communication systems having a first communication line, referred to as a "primary line," and at least one additional communication line connecting a transmission system to a remote receiving system. Note that more than one primary line is possible in other embodiments.

The additional communication line provides additional capacity such that communication of payload data between the transmitting and receiving systems may be maintained at or above a specified data rate if the first communication line becomes significantly degraded. Thus, the additional communication line can be effectively used to backup the communication occurring over the primary line. However, rather than keeping the additional communication line idle while the primary line is up and running, the additional capacity provided by the additional communication line is used to increase the system's overall capacity for transmitting parity information, which is used by the receiving system to correct for data errors. Thus, the performance of the communication system is improved even when the primary line is not interrupted or significantly degraded by increasing the system's capacity for transmitting parity symbols.

If communication over the primary line becomes significantly degraded, then the transmission of payload data over the primary line can be switched to the additional communication line. However, if the specified data rate cannot be maintained between the transmission and receiving systems after such a switch, then the transmission of FEC parity information may be disabled thereby increasing the capacity of the additional communication line to transmit payload data. Exemplary embodiments achieving such functionality are described in commonly-assigned U.S. patent application Ser. No. 10/668,030 filed on Sep. 22, 2003, which is incorporated herein by reference.

Unfortunately, the switching of data from the primary line to the additional communication can cause inefficiencies. For example, additional signaling between the transmission and receiving systems to coordinate the switching may be necessary. Further, delays at the transmission system may be incurred as it is reconfigured to switch the transmission of payload data from the primary line to the additional communication line. Also, the additional communication line is idle while the primary line is not significantly degraded. Thus, no benefit is derived from the additional communication line unless the primary line experiences significant degradation.

To avoid such inefficiencies, a communication system in accordance with at least one embodiment of the present disclosure refrains from switching communication from the degraded primary line to the additional communication line. In this regard, rather than performing such a switch, the communication system continues to transmit information over the primary line even if this line becomes significantly degraded. The receiving system, however, switches from "non-erasure decoding" to erasure decoding and begins to mark each symbol transmitted over the degraded primary line as an error. Note that any error correction technique known in the art other than erasure decoding that is employed by the receiving system is hereinafter referred to as "non-erasure decoding." Using the parity information from the additional communication line, the receiving system can recover the payload data transmitted over the degraded primary line.

Notably, the overall data capacity between the transmitting and receiving systems may not be increased due to the continued transmission of data over the degraded line since parity information for correcting the marked errors from the degraded primary line usurps data capacity from the additional communication line. Nevertheless, handling a significant degradation of the primary line in the aforedescribed manner has various advantages.

For example, the operation of the transmission system does not need to be changed when the primary line becomes significantly degraded. Thus, additional signaling to inform the transmission system to switch communication from the degraded primary line to the additional communication line is unnecessary. Further, the transmission system does not need to switch communication of data from the degraded primary line to the additional communication line, and the delays and inefficiencies resulting from the transmission system making such a switch may be avoided. Thus, the overall performance of the communication system can be improved.

Note that a variety of parameters and techniques may be used to determine whether a communication line is "significantly degraded." For example, a communication line may be considered to be "significantly degraded" if the signal-to-noise ratio (SNR) of the signals communicated over the communication line falls below a predetermined threshold value or if the communication line is severed or otherwise damaged such that it is unable to communicate any data. The performance of a communication line may also be significantly degraded if it is disconnected from a transceiver or if a transceiver connected to the communication line malfunctions. If a communication line becomes significantly degraded, the receiving system employs erasure decoding to correct errors in the symbols transmitted over the degraded communication line.

FIG. 1 depicts an exemplary FEC communication system 10 in accordance with one embodiment of the present invention. As shown by FIG. 1, the system 10 comprises a transmission system 12 that communicates with a receiving system 17 via a plurality of communication lines 35-37. Note that while FIG. 1 shows three communication lines 35-37, the system 10 may comprise more than three or as few as two lines in other embodiments of the present disclosure.

Each of the communication lines 35-37 may comprise any suitable communication connection that enables the transmission system 12 to communicate with the receiving system 17. Further, it is possible for the lines 35-37 to pass through one or more networks (not shown) and/or comprise wired and/or wireless links. As an example, each line 35-37 may comprise a pair of conductive connections, sometimes referred to as a "twisted pair," sufficient for enabling various types of communication, such as DSL communication (e.g., HDSL, ADSL, etc.), between the transmission and receiving systems 12 and 17. However, other types of communication connections or links may be used in other embodiments, if desired. In one embodiment of the FEC communication system, the communication lines 35-37 connecting the transmission system 12 and the receiving system 17 have identical communication rates, although communication lines having different communication rates are possible in other embodiments.

The transmission system 12 comprises a forward error correction (FEC) module 25 and a transmission module 33. The FEC Module 25 receives payload data 15 that is to be transmitted to the receiving system 17. The FEC module 25 encodes the payload data 15 converting the payload data 15 into a plurality of code words comprising payload symbols and corresponding parity symbols, which are described in more detail hereafter. The FEC module 25 may generate the code words using well-known or future-developed FEC encoding methods.

Further, to compensate for impulse noise, the FEC module 25 preferably interleaves the payload symbols and the parity symbols, and the transmission module 33 transmits the interleaved payload symbols and parity symbols over the communication lines 35-37 to the receiving system 17.

If desired, one or more of the communication lines 35-37 may be dedicated to transmitting parity symbols, and the remaining communication lines may be dedicated for transmitting payload data. However, any of the communication lines may be used to transit both parity symbols and payload symbols. Techniques for interleaving code words to reduce the effects of impulse noise are generally well-known, and exemplary techniques for interleaving FEC code words are described in U.S. patent application Ser. No. 10/668,030, filed on Sep. 22, 2003, which is incorporated herein by reference.

The receiving system 17 comprises a reception module 45 and an FEC module 111. Upon receipt of the interleaved data, representative of the payload data 15, and the parity symbols, the FEC module 111 de-interleaves the payload symbols and parity symbols transmitted by the plurality of lines 35-37 in order to obtain the code words generated by the FEC module 25. Furthermore, the FEC module 111 uses the parity symbols contained within each corrupted code word to correct errors that may have been caused, for example, by noise on the communication lines 35-37 during transmission.

In one embodiment of the receiving system 17 of the present disclosure, if communication over one of the communication lines 35-37 is significantly degraded, the reception module 45 begins to mark each symbol that is received over the degraded communication line 35-37 as an erasure regardless of whether or not the symbol is actually corrupted.

Notably, as described above, communication over one of the communication lines 35-37 may become interrupted or significantly degraded due to various reasons. For example, the communication line may be severed or otherwise damaged. Alternatively, a transceiver at the transmission system 12 may stop transmitting or undesirably generate a significant number of errors, or a significant amount of noise from external interference may be present. Moreover, in one embodiment, the receiving system 17 is configured to determine a parameter indicative of signal quality for each line 35-37 and to determine whether the communication over any of the lines has become significantly degraded based on the lines' corresponding signal quality parameter. In one exemplary embodiment, the signal quality parameter for each of the lines 35-37 is a signal-to-noise ratio (SNR). Techniques for calculating the SNR for a given communication line are generally well-known and will not be described in detail herein. Moreover, the receiving system 17 determines the SNR for each communication line 35-37, and compares each SNR to a specified threshold. If the SNR for any of the communication lines is below the specified threshold, then the receiving system 17 determines that the communication over such a line is significantly degraded.

If the receiving system 17 determines that communication over a particular communication line 35-37 has become significantly degraded (e.g., the line's SNR has fallen below the specified threshold), then the reception module 45 marks each symbol received from the particular communication line as an erasure, as described hereinabove, and the FEC module 111 applies erasure decoding in order to correct the erasures indicated by the marking. In this regard, the FEC module 111 may use any well known or future-developed erasure decoding technique in order to regenerate, based on parity symbols and/or payload symbols from other communication lines, the symbols marked as erasures by the receiving system 17.

While the FEC module 11 is reconciling erasures present in payload symbols received from one of the communication lines 35-37, the amount of errors that can be compensated for the other communication lines may be limited since parity information is usurped by the erasure decoding. Indeed, if the available parity information is insufficient to enable the correction of a significant number of errors, the non-erasure decoding performed by the FEC module in non-erasure decoding mode may be discontinued during the erasure mode.

Figure 2:
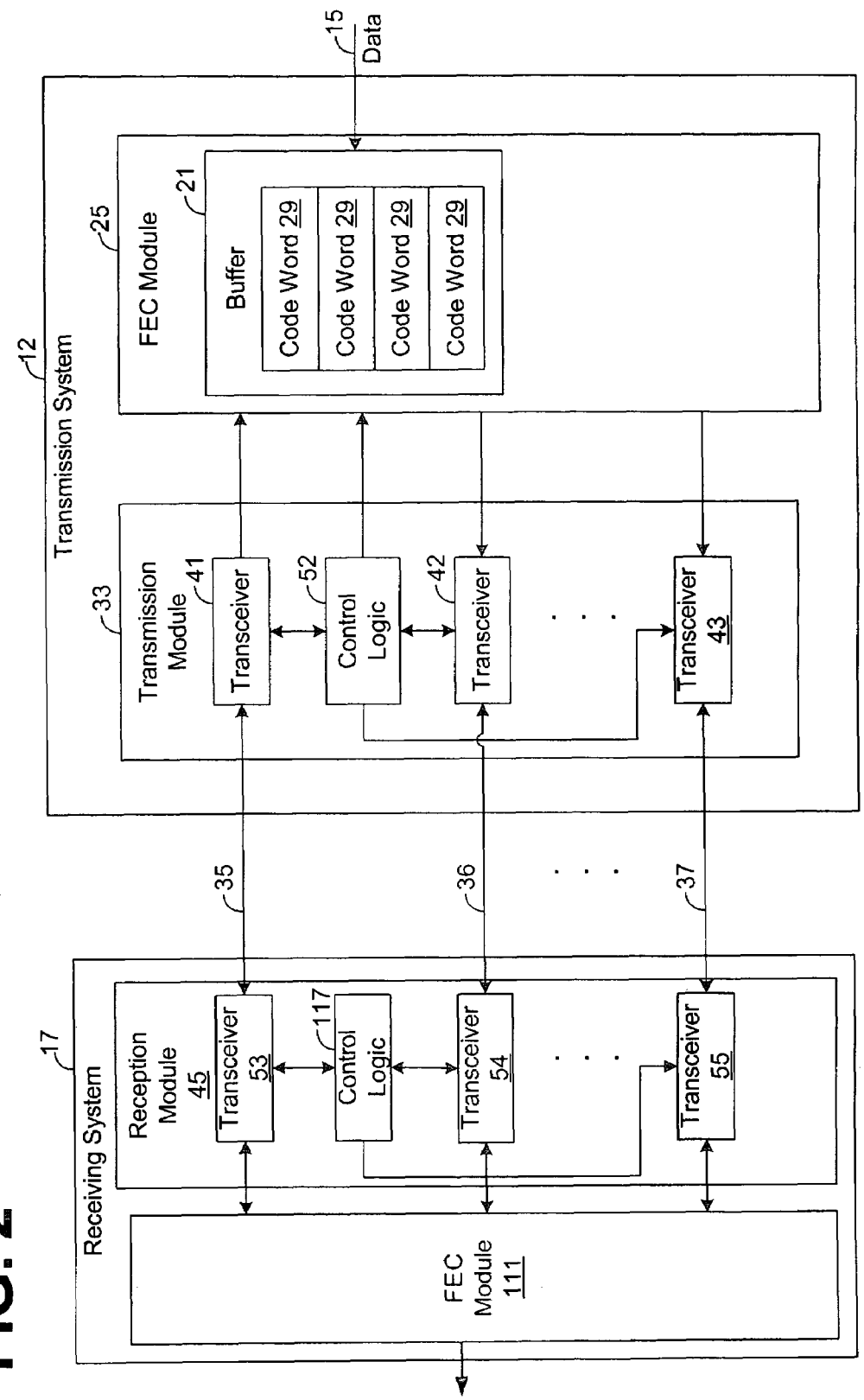
FIG. 2 is a block diagram illustrating a more detailed view of the exemplary communication system depicted in FIG. 1.

FIG. 2 depicts a more detailed illustration of the communication system 10 of FIG. 1. The data from the stream 15, which may also be referred to as "payload data," is temporarily stored within a buffer 21 by an FEC module 25. As will be described in more detail hereafter, the FEC module 25 defines FEC code words 29 based on the received data stream 15. A portion of each code word 29 comprises at least one payload symbol indicative of the payload data 15 and another portion of each code word 29 comprises data indicative of corresponding parity data that may be used to recover corrupted bits of the payload data in the same code word 29. Such code words 29 will be described in more detail hereinbelow.

A transmission module 33 reads data from the buffer 21 and transmits this data to the receiving system 17. As described hereinabove, the transmission module 33 is communicatively coupled to the receiving system 17 via a plurality of communication lines 35-37, and the transmission module 33 transmits at least a portion of one or more code words for each communication line 35-37.

As shown by FIG. 2, the transmission module 33 preferably comprises a transceiver for each communication line 35-37 that may be used to communicate with the receiving system 17. In the exemplary embodiment depicted by FIG. 2, three communication lines 35-37 are depicted for such communication. In such an embodiment, the transmission module 33 comprises three transceivers 41-43 for communicating over lines 35-37, respectively.

However, in other embodiments, additional communication lines (not shown) for communicating between the systems 12 and 17 may exist. In such embodiments, the transmission module 33 may comprise additional transceivers (not shown) for enabling communication over these additional communication lines. Furthermore, as noted herein, while the system 10 of FIG. 2 shows three communication lines 35-57, fewer communication lines 35-37 are possible. For example, the system 10 may comprise only two communication lines 35 and 36.

The receiving system 17 preferably comprises a transceiver for each communication line 35-37 that may be used to communicate between the transmission and receiving systems 12 and 17. In the exemplary receiver 17 of FIG. 2, the reception module 45 of the receiving system 17 comprises three transceivers 53-55 for communicating over lines 35-37, respectively. However, as described above, additional communication lines (not shown) or fewer communication lines for communicating between the systems 12 and 17 are possible. In such embodiments, the receiving system 17 may comprise other numbers of transceivers for enabling communication over the communication lines between systems 12 and 17.

The reception module 45 further comprises control logic 117 for controlling the reception of data from the transmission system 12 and for controlling a decoding mode of the receiver 17. In this regard, the receiver 17 may employ non-erasure decoding in a first mode, or the receiver 17 may employ erasure decoding in a second mode, hereinafter referred to as "erasure mode," as described hereinabove. As used herein, "non-erasure decoding" refers to decoding techniques that use transmitted parity information to discover the location of errors to correct for such errors.

In non-erasure decoding mode, the receiving system 17 uses non-erasure decoding techniques to correct for errors in the code words. That is, the receiving system 17 uses the transmitted parity symbols to discover locations of errors in the code words and to correct for the discovered errors.

In erasure mode, the control logic 117 flags each symbol received via a significantly degraded communication line (e.g., if the SNR of signals communicated over the line falls below a specified threshold) as an erasure. The FEC module 111 then uses parity data in order to regenerate the data contained within the flagged symbols. As described hereinabove, when the receiver 17 is in erasure mode, the location of the errors being received is known, as opposed to non-erasure decoding mode.

In this regard, if communication over one of the communication lines 35-37 is significantly degraded (e.g., if the SNR of signals communicated over the line falls below a specified threshold), then the control logic 117 begins to mark each symbol received from the significantly degraded line 35-37 as an erasure, and the FEC module 111 uses erasure decoding in order to regenerate such erasures. Thus, the receiving system 17 begins to use erasure decoding to recover each symbol transmitted over the degraded communication line.

Once the communication line is no longer significantly degraded (e.g. the SNR of the signals transmitted over the degraded line exceeds the specified threshold), the control logic 117 discontinues marking symbols from the degraded line erasures, and the FEC module 111 switches from erasure decoding to another type of decoding as for the symbols transmitted. In one embodiment, the FEC module 111 switches back to non-erasure decoding mode used prior to the erasure mode.

Figure 3:
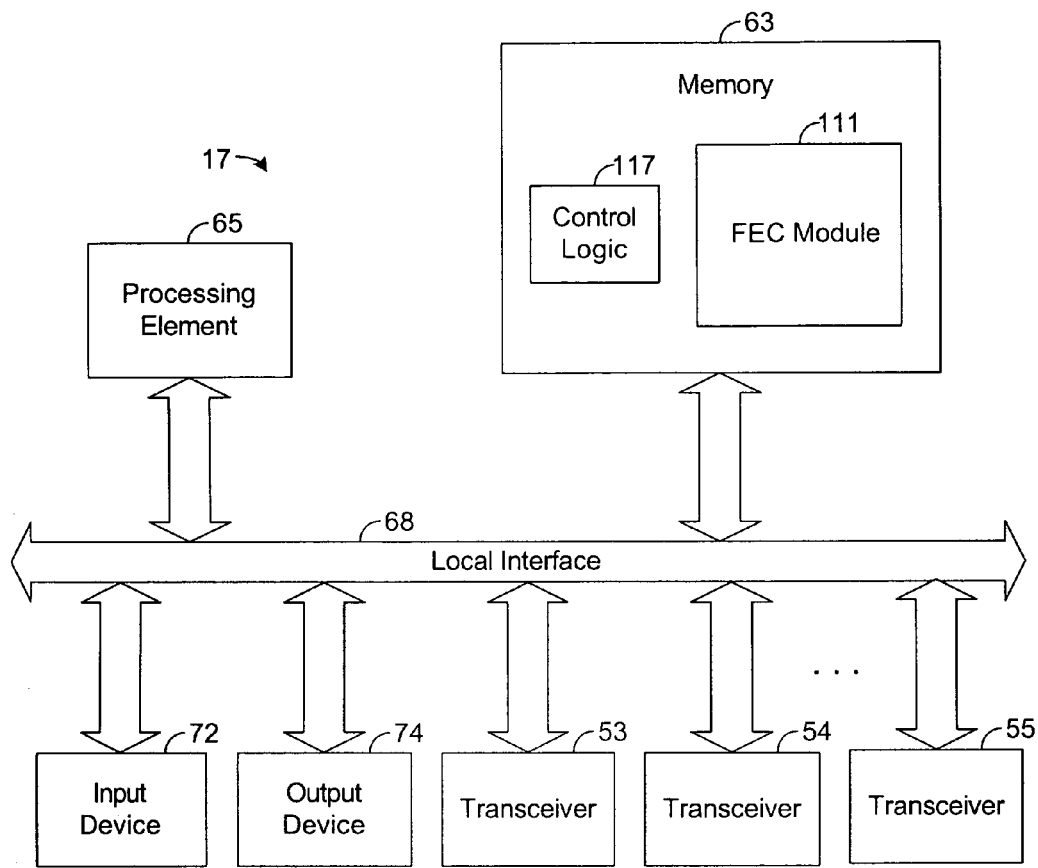
FIG. 3 is a block diagram illustrating an exemplary transmission system depicted in FIG. 2.

The control logic 117 may be implemented in hardware, software, or a combination thereof. FIG. 3 shows an exemplary embodiment of the receiving system 17 where the control logic 117 and the FEC module 111 are both implemented in software and stored within memory 63 of the system 17.

The exemplary embodiment of the receiving system 17 depicted by FIG. 3 comprises at least one conventional processing element 65, such as a digital signal processor (DSP) or a central processing unit (CPU), that communicates to and drives the other elements within the system 17 via a local interface 68, which can include at least one bus. Furthermore, an input device 72 can be used to input data from a user of the system 17, and an output device 74 can be used to output data to the user.

Note that components of the transceivers 53-55 may also be implemented in software and/or hardware. Any software of any of the transceivers 53-55 may be executed by the processing element 65, or the transceivers 53-55 may comprise one or more DSPs or other type of processing devices separate from the processing element 65 for executing such software.

Further note that the control logic 117 and/or the FEC module 111, when implemented in software, can be stored and transported on any computer-readable medium for use by or in connection with an instruction execution system, apparatus, or device, such as a computer-based system, processor-containing system, or other system that can fetch and execute instructions. In the context of this document, a "computer-readable medium" can be any means that can contain, store, communicate, propagate, or transport a program for use by or in connection with the instruction execution system, apparatus, or device. The computer readable-medium can be, for example but not limited to, an electronic, magnetic, optical, electromagnetic, infrared, or semiconductor system, apparatus, device, or propagation medium. Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 4:
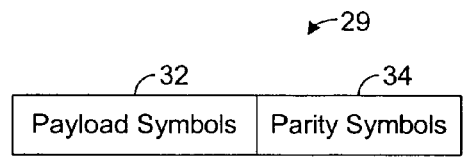
FIG. 4 is a block diagram illustrating a code word formed by an FEC module depicted in FIG. 1.

As shown by FIG. 4, each code word 29 defined by the FEC module 25 of FIG. 2 comprises a payload symbol portion 32 and a parity symbol portion 34, as indicated hereinabove. The payload symbol portion 32 comprises data symbols from the data stream 15. A "symbol" is a unit of one or more bits of information. In the embodiments specifically described herein, it will be assumed that each symbol has the same bit length. This method of creating codewords where the data symbols and parity symbols are readily distinguishable is known as a systematic code. The techniques described herein can use other coding methods such as non-systematic codes.

The parity symbol portion 34 is based on the payload symbol portion 32 of the same code word 29, and the symbols of the parity symbol portion 34 define sufficient information for enabling the receiving system 17 (FIG. 1) to recover at least one corrupted symbol of the payload symbol portion 32 via known or future-developed non-erasure decoding techniques or schemes. In some non-erasure decoding schemes, the parity symbol portion 34 represents the result of mathematically or logically combining the data symbols of portion 32 of the same code word 29. Thus, if some of the data symbols are successfully received by the receiving system 17 (FIG. 1), the system 17 can combine the received data symbols with the symbols of the parity symbol portion 34 to recover one or more corrupted data symbols. The maximum number of data symbols of a code word 29 capable of being corrected and, hence, the minimum number of symbols of the code word 29 that must be successfully received to enable FEC recovery of the code word 29 depend on the type of FEC scheme being used. Generally, more robust FEC schemes (i.e., FEC schemes that enable a greater number of corrupted symbols of a single code word 29 to be recovered) have more information in the parity symbol portion 34. Thus, more robust FEC schemes, while enabling the correction of more symbols, also tend to increase delay and complexity and can have an adverse impact on throughput.

Thus, the FEC module 25 is configured to encode the data from the stream 15 in accordance with encoding techniques known in the art. In accordance with such encoding techniques, the FEC module 25 encodes the payload data 15 into payload symbols 32, generates corresponding parity symbols 34 creating code words 29, and interleaves these symbols. The control logic 52 transmits, over the communication lines 35-37, the interleaved payload symbols 32 and parity symbols 34 created by the FEC module 25.

To better illustrate principles of the present disclosure, an exemplary use and operation of the transmission and receiving systems 12 and 17 will now be described with reference to FIGS. 5 and 6.

In the present example, assume that only communication lines 35 and 36 are used for communicating between systems 12 and 17. Further assume that the control logic 52 of the transmission system 12 is configured to transmit each payload symbol 32 via line 35 and to transmit each parity symbol 34 via line 36. Further assume that the FEC module 25 of the transmission system 12 is configured to generate Reed-Solomon (RS) code words 29, although other types of code words may be generated in other examples. For RS encoding, a code word 29 has parameters (N,K), where N is the total number of code word symbols, K is the number of payload symbols, and N−K is the number of parity symbols present in each code word 29. For such code words, assume that the FEC module 111 is capable of correcting up to (N−K)/2 errors in non-erasure decoding or reconciling up to (N−K) erasures in erasure mode. As described herein, in non-erasure decoding mode both the location and the magnitude of the error are unknown, and in erasure mode the location of the erasure is known. In the present example, twice as many erasures can be corrected as errors, assuming that each corrected error and each recovered erasure are of the same bit length. In the present example, N−K=K or equivalently K/N=½.

Figure 5:
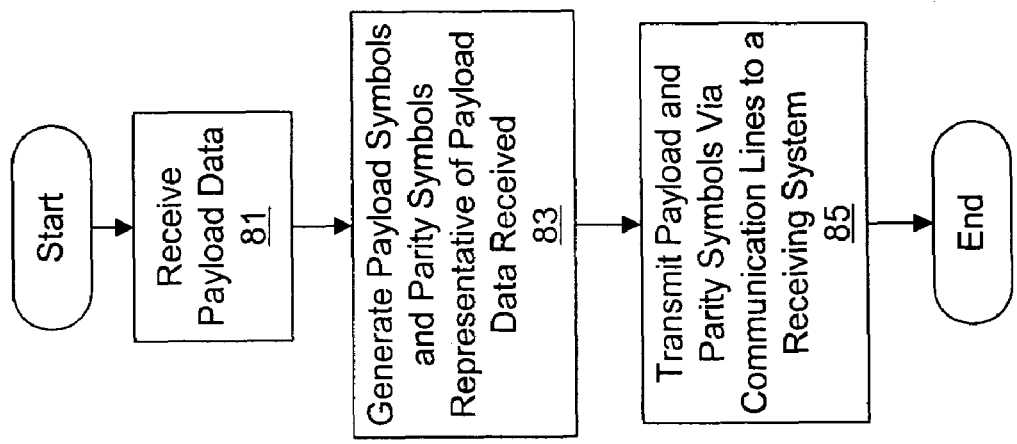
FIG. 5 is a flow chart illustrating an exemplary architecture and functionality of the receiving system depicted in FIG. 1.
Figure 6:
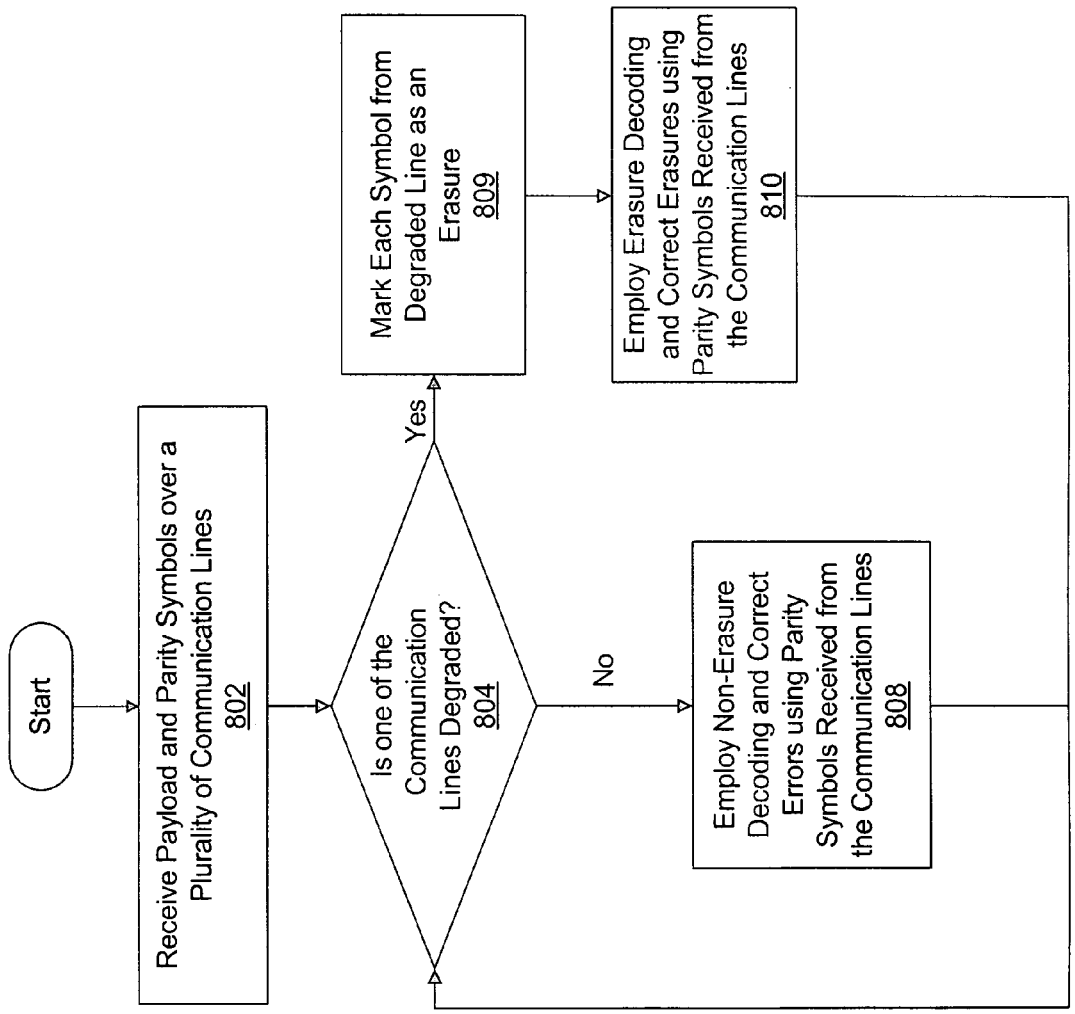
FIG. 6 is a flow chart illustrating an exemplary architecture and functionality of the transmission system depicted in FIG. 1.

FIG. 5 illustrates the architecture and functionality of the transmitter 12. In the present example, the transmitter 12 (FIG. 2) receives payload data 15 in block 81. The FEC module 25 (FIG. 2) generates payload symbols and parity symbols representative of the payload data received in block 83. The transmission module 33 transmits payload and parity symbols via the communication lines 35-37 to a receiving system 17 in block 85.

Initially, the transceivers 41 and 42 of the receiving system 17 are in non-erasure decoding mode and thus use non-erasure decoding to decode the code words 29 and to correct for errors in the code words. In the present example when the system 12 is transmitting payload symbols via communication line 35 and parity symbols via line 36, the transceivers 41 and 42 respectively receive the payload symbols and parity symbols, as shown by block 802 of FIG. 6, and the control logic 117 determines whether line 35 has become significantly degraded in block 804. If communication line 35 is significantly degraded, then the control logic 117 marks each symbol received from communication line 35 as an erasure, as indicated in block 809, and the FEC module 111 employs erasure decoding, as indicated by block 810, to recover each symbol. Thus, the FEC module 111 transitions to erasure decoding to recover each symbol from the line 35.

Once the communication over line 35 improves such that the line is no longer considered to be significantly degraded (e.g., the SNR associated with line 35 rises above the specified threshold), the control logic 117 detects this change and controls the transceiver 41 such that the control logic 117 switches from erasure mode and begins non-erasure decoding mode. In particular, the control logic 117 makes a "no" determination in block 804 of FIG. 6 and the transceiver 41 uses the parity symbols from line 36 to decode the payload symbols from line 35 and to correct for errors in the payload data, as indicated by blocks 808. Thus, the transceiver 41 transitions from erasure mode to non-erasure decoding mode. A comparable process would occur if communication line 36 were significantly degraded rather than communication line 35.

Notably, the control logic 117 of the receiving system 17 and the control logic 52 of the transmission system 12 do not necessarily have to communicate in order to effectuate the transition back and forth between non-erasure decoding mode and erasure mode during communication. In this regard, it is unnecessary for the configuration or operation of the transmission system 12 to change when the decoding at the receiving changes from non-erasure to erasure decoding and vice versa. Indeed, it is unnecessary for any component of the transmission system 12 to even be aware of a change in the decoding being performed at the receiving system 17. Thus, the system 10 is able to accommodate a significant degradation of the communication occurring over a communication line without disrupting or adversely affecting the operation of the transmission system 12.

Now, therefore, the following is claimed:

1. A communication system, comprising:
   a plurality of communication transceivers respectively coupled to a plurality of communication lines and configured to receive payload symbols and parity symbols from the communication lines, the plurality of communication lines including at least a first communication line and a second communication line;
   decoding logic configured to decode symbols from the first communication line based on the parity symbols, the decoding logic further configured to decode symbols from the second communication line based on the parity symbols; and
   control logic configured to mark one symbol from the first communication line as an erasure based on a measured communication performance of the first communication line, wherein the decoding logic is configured to decode the one symbol marked as the erasure using erasure decoding based on at least one of the parity symbols from the second communication line, wherein the control logic is configured to mark as erasures all symbols simultaneously on the first communication line at a single instant, and wherein the decoding logic is configured to decode all of the payload symbols simultaneously on the first communication line at the single instant using erasure decoding based on a plurality of parity symbols from the second communication line.

2. The communication system of claim 1, wherein the control logic is configured to measure the performance of each of the plurality of communication lines by determining a plurality of values indicative of a signal quality of signals communicated over each of the communication lines, the logic further configured to compare the values to a threshold.

3. The communication system of claim 2, wherein the values are signal-to-noise ratios.

4. The communication system of claim 1, wherein the control logic is further configured to begin marking as erasures each symbol received from the first communication line based on the measured communication performance.

5. The communications system of claim 1, wherein the control logic is further configured to mark as erasures uncorrupted symbols received from the first communication line.

6. The communication system of claim 1, wherein the control logic is further configured to mark as an erasure, based on the measured performance, an uncorrupted symbol received from the first communication line.

7. The communication system of claim 1, wherein the measured communication performance is based on symbols received from the first communication line prior to reception of the one symbol from the first communication line regardless of whether the one symbol is corrupted.

8. The communication system of claim 1, wherein the first communication line is not operational for communicating data while the one symbol is being transmitted over the first communication line.

9. A communication method, comprising the steps of:
   encoding payload data;
   interleaving the encoded data over a plurality of communication channels, the plurality of communication channels including at least a first communication channel and a second communication channel;
   transmitting the interleaved data over each of the plurality of communication channels;
   correcting errors in the interleaved data when each of the plurality of channels is operational for communicating data;
   determining that the first communication channel is not operational for communicating data;
   marking, in response to the determining step as erasures all symbols simultaneously on the first communication channel at a single instant when the first communication channel is not operational for communicating data; and
   correcting errors and erasures in the interleaved data when the first communication channel is not operational for communicating data by using erasure decoding to decode all of the interleaved data marked as the erasures based on parity symbols from the second communication channel.

10. The communication method of claim 9, wherein data rates of each communication lines are equal.

11. An apparatus for use in a communication system, the apparatus comprising:

a reception module configured to receive payload data from a plurality of communication channels, the plurality of communication channels including at least a first communication channel and a second communication channel; and an error correction module configured to correct errors in the received data when each of the plurality of communication channels is operational for communicating data, the error correction module further configured to correct errors and erasures in the received data when the first communication channel is not operational for communicating data by marking as erasures all symbols simultaneously on the first communication channel at a single instant and decoding all of the payload symbols simultaneously on the first communication channel at the single instant using erasure decoding based on a plurality of parity symbols from the second communication channel.

12. A communication system, comprising:

a plurality of communication transceivers respectively coupled to a plurality of communication lines and configured to receive payload symbols and parity symbols from the communication lines, the plurality of communication lines including at least a first communication line and a second communication line;

decoding logic configured to decode symbols from the first communication line based on the parity symbols, the decoding logic further configured to decode symbols from the second communication line based on the parity symbols; and control logic configured to mark one symbol from the first communication line as an erasure based on a measured communication performance of the first communication line and to thereafter mark as erasures each symbol received from the first communication line until the measured communication performance of the first communication line reaches a specified threshold, wherein the decoding logic is configured to decode the one symbol marked as the erasure using erasure decoding based on at least one of the parity symbols from the second communication line and to decode each of the symbols marked as the erasures based on a plurality of parity symbols from the second communication line without using any parity symbols from the first communication line.

* * * * *